(12) United States Patent
Lim

(10) Patent No.: US 12,387,808 B2
(45) Date of Patent: Aug. 12, 2025

(54) DATA CORRECTING DEVICE AND DATA CORRECTING METHOD THEREOF

(71) Applicant: SK hynix Inc., Gyeonggi-do (KR)

(72) Inventor: Jae Il Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/480,506

(22) Filed: Oct. 4, 2023

(65) Prior Publication Data

US 2024/0395346 A1 Nov. 28, 2024

(30) Foreign Application Priority Data

May 26, 2023 (KR) .......................... 10-2023-0068349

(51) Int. Cl.
*G11C 29/10* (2006.01)

(52) U.S. Cl.
CPC .................................... *G11C 29/10* (2013.01)

(58) Field of Classification Search
CPC ......... G11C 29/10; G11C 29/56; G11C 29/48; G11C 29/44; G11C 29/50; G11C 29/14
USPC .................................................. 714/718, 719
See application file for complete search history.

(56) References Cited

U.S. PATENT DOCUMENTS

| | | | | |
|---|---|---|---|---|
| 2007/0133325 A1* | 6/2007 | Kwon | ..................... | G11C 29/76 365/201 |
| 2010/0287447 A1* | 11/2010 | Eun | ..................... | G06F 11/1068 714/763 |
| 2015/0309872 A1* | 10/2015 | Cai | ..................... | G06F 11/1076 714/764 |
| 2016/0155515 A1* | 6/2016 | Son | ..................... | G11C 11/1673 714/719 |
| 2017/0085277 A1 | 3/2017 | Chen et al. | | |
| 2018/0165151 A1* | 6/2018 | Lee | ..................... | G06F 11/1048 |
| 2018/0217894 A1* | 8/2018 | Park | ..................... | G11C 29/42 |
| 2019/0012230 A1* | 1/2019 | Chung | ................ | G06F 11/1048 |
| 2019/0163570 A1* | 5/2019 | Kim | ..................... | G06F 11/1004 |
| 2021/0265003 A1* | 8/2021 | Lee | ..................... | G11C 29/42 |
| 2022/0293205 A1* | 9/2022 | Oh | ..................... | G11C 29/36 |

FOREIGN PATENT DOCUMENTS

KR   10-2010-0120991 A   11/2010

OTHER PUBLICATIONS

Yingquan Wu, New Scalable Decoder Architectures for Reed-Solomon Codes, IEEE Transactions on Communications, Aug. 2015, p. 2741-2761, vol. 63, No. 8.
Seongju Lee et al., 23.4 A 512GB 1.1V Managed DRAM Solution with 16GB ODP and Media Controller, IEEE International Solid-State Circuits Conference, 2019, p. 384-386, IEEE Xplore.

* cited by examiner

*Primary Examiner* — Albert Decady
*Assistant Examiner* — Osman M Alshack
(74) *Attorney, Agent, or Firm* — IP & T GROUP LLP

(57) ABSTRACT

Disclosed is a device for correcting an erasure including a defect symbol location generating unit and an erasure decoding unit. The defect symbol location generating unit generates third information on a location of an erasure. The erasure decoding unit performs an erasure correcting operation on a read codeword read from a memory unit based on the third information.

32 Claims, 5 Drawing Sheets

DATA CORRECTING DEVICE AND DATA CORRECTING METHOD THEREOF

CROSS-REFERENCE TO RELATED APPLICATION(S)

This application claims priority under 35 U.S.C. § 119 to Korean Patent Application No. 10-2023-0068349, filed on May 26, 2023, the disclosure of which is incorporated herein by reference in its entirety.

BACKGROUND

1. Field

Various embodiments of the present disclosure relate to a data correction technique, and more particularly, to erasure or errata correction schemes.

2. Description of the Related Art

Due to a temporary or permanent cause, data stored in a memory medium may contain an error and therefore may be corrupted. Such an operation of detecting and correcting the error is commonly referred to as an error correcting operation. The error correcting operation includes an encoding operation process and a decoding operation process.

In the encoding operation process, an error correction code is added to original data. A group of the original data and the error correction code is stored as a codeword in the memory medium.

The codeword stored in the memory medium is read from the memory medium at a later time. In this case, since the original data included in the codeword has been stored in the memory medium, it may contain an error and therefore may be corrupted. In a decoding operation process, the error included in the corrupted data may be detected and corrected on the basis of the error correction code included in the codeword read from the memory medium, and eventually the original data may be restored.

The error correction code may be defined in various ways according to an error correction scheme, and an error correction capability of the error correction code also varies. When the number of errors included in the corrupted data exceeds the error correction capability of the error correction code, the error correcting operation is regarded as a failure.

SUMMARY

Various embodiments of the present disclosure are directed to an improved errata correction scheme.

In accordance with an embodiment of the present disclosure, a method of correcting an errata may include: generating first information on defect bits respectively regarded as corresponding to one or more defects included in a memory unit; generating second information on one or more defect symbols based on the first information; generating third information on a location of an erasure based on the second information; and performing, based on the third information, an errata correcting operation on a read codeword read from the memory unit.

The generating the first information may include: a first operation of storing in the memory unit a selected test pattern from one or more original test patterns; a second operation of reading as a read test pattern the test pattern from the memory unit; a third operation of detecting as a defect bit, an inconsistent bit between the selected pattern and the read test pattern; and a fourth operation of generating the first information from one or more defect bits as a result of the third operation.

The original test patterns may have different values from each other.

The generating the first information may further include a fifth operation of repeating the first to fourth operations on the individual original test patterns.

The first information generated through the fifth operation may include pieces corresponding to the respective original test patterns.

The original test patterns may have randomness.

The pieces may be defect bitmaps.

Each of the defect bitmaps may include information on an inconsistent bit between a corresponding test pattern of the original test patterns and a corresponding read test pattern of the read test patterns.

Each of the original test patterns may have the same size as the read codeword.

The second information may be generated on the basis of information on defect bits included in each of the defect bitmaps.

Each of the defect symbols may indicate that one or more symbols among corresponding symbols included in the defect bitmaps include the defect bit.

The second information may be a defect symbol map having the same size as the read codeword.

The third information may be erasure locator information that regards as an erasure each of the defect symbols.

The errata correcting operation may be an operation of correcting at least one error or at least one erasure included in at least one data symbol included in the read codeword.

The method may further include storing the corrected codeword in the memory unit when the errata correcting operation succeeds.

The method may further include storing the read codeword in the memory unit when the errata correcting operation fails.

The read codeword may be a codeword encoded according to a Reed-Solomon scheme.

The generating of the first information may be performed in response to failure of an error correcting operation performed on the read codeword.

The generating of the first information may be performed in response to failure of an errata correcting operation performed on the read codeword.

In accordance with an embodiment of the present disclosure, a device for correcting an erasure may include: a defect symbol location generating unit configured to generate third information on a location of an erasure; and an errata decoding unit configured to perform, based on the third information, an errata correcting operation on a read codeword read from a memory unit. The defect symbol location generating unit may be further configured to generate first information on defect bits respectively regarded as corresponding to one or more defects included in the memory unit and generate second information on one or more defect symbols based on the first information. The defect symbol location generating unit may generate the third information based on the second information.

The generating the first information may include a first operation of storing in the memory unit a selected test pattern from one or more original test patterns, a second operation of reading as a read test pattern the test pattern from the memory unit, a third operation of detecting as a defect bit an inconsistent bit between the selected pattern and the read test pattern, and a fourth operation of generating the first information from one or more defect bits as a result of the third operation.

The original test patterns may have different values from each other.

The generating the first information may further include a fifth operation of repeating the first to fourth operations on the individual original test patterns.

The first information generated through the fifth operation may include pieces corresponding to the respective original test patterns.

The original test patterns may have randomness.

The pieces may be defect bitmaps.

Each of the defect bitmaps may include information on an inconsistent bit between a corresponding test pattern of the original test patterns and a corresponding read test pattern of the read test patterns.

Each of the original test patterns may have the same size as the read codeword.

The defect symbol location generating unit may generate the second information based on information on defect bits included in each of the defect bitmaps.

Each of the defect symbols may indicate that one or more symbols among corresponding symbols included in the defect bitmaps include the defect bit.

The second information may be a defect symbol map having the same size as the read codeword.

The third information may be erasure locator information that regards as an erasure each of the defect symbols.

The errata correcting operation may be an operation of correcting at least one error or at least one erasure included in at least one data symbol included in the read codeword.

The errata decoding unit may be further configured to perform an operation of storing the corrected codeword in the memory unit when the errata correcting operation succeeds.

The errata decoding unit may be further configured to perform an operation of storing the read codeword in the memory unit when the errata correcting operation fails.

The read codeword may be a codeword encoded according to a Reed-Solomon scheme.

The defect symbol location generating unit may generate the first information when the errata decoding unit fails an error correcting operation performed on the read codeword.

The defect symbol location generating unit may generate the first information when the errata decoding unit fails an errata correcting operation performed on the read codeword.

In accordance with an embodiment of the present disclosure, a method of correcting an erasure may include: generating first information on defect bits respectively regarded as corresponding to one or more defects included in a memory unit; generating second information on one or more defect symbols based on the first information; generating third information on a location of an erasure based on the second information; and performing, based on the third information, an erasure correcting operation on a read codeword read from the memory unit.

The generating the first information may include: a first operation of storing in the memory unit a pattern selected from one or more original test patterns; a second operation of reading as a read test pattern the test pattern from the memory unit; a third operation of detecting as a defect bit an inconsistent bit between the selected pattern and the read test pattern; and a fourth operation of generating the first information from one or more defect bits as a result of the third operation.

The original test patterns may have different values from each other.

The generating the first information may further include a fifth operation of repeating the first to fourth operations on the individual original test patterns.

The first information generated through the fifth operation may include pieces corresponding to the respective original test patterns.

The original test patterns may have randomness.

The pieces may be defect bitmaps.

Each of the defect bitmaps may include information on an inconsistent bit between a corresponding test pattern of the original test patterns and a corresponding read test pattern of the read test patterns.

Each of the original test patterns may have the same size as the read codeword.

The second information may be generated on the basis of information on defect bits included in each of the defect bitmaps.

Each of the defect symbols may indicate that one or more symbols among corresponding symbols included in the defect bitmaps include the defect bit.

The second information may be a defect symbol map having the same size as the read codeword.

The third information may be erasure locator information that regards as an erasure each of the defect symbols.

The erasure correcting operation may be an operation of correcting at least one erasure included in at least one data symbol included in the read codeword.

The method may further include storing the corrected codeword in the memory unit when the erasure correcting operation succeeds.

The method may further include storing the read codeword in the memory unit when the erasure correcting operation fails.

The read codeword may be a codeword encoded according to a Reed-Solomon scheme.

The generating the first information may be performed in response to failure of an error correcting operation performed on the read codeword.

The generating of the first information may be performed in response to failure of an erasure correcting operation performed on the read codeword.

In accordance with an embodiment of the present disclosure, a device for correcting an erasure may include: a defect symbol location generating unit configured to generate third information on a location of an erasure; and an erasure decoding unit configured to perform, based on the third information, an erasure correcting operation on a read codeword read from a memory unit.

The defect symbol location generating unit may be further configured to generate first information on defect bits respectively regarded as corresponding to one or more defects included in the memory unit and generate second information on one or more defect symbols based on the first information, and the defect symbol location generating unit may generate third information based on the second information.

The generating the first information may include a first operation of storing in the memory unit a pattern selected from one or more original test patterns, a second operation of reading as a read test pattern the test pattern from the memory unit, a third operation of detecting as a defect bit an inconsistent bit between the selected pattern and the read test pattern, and a fourth operation of generating the first information from one or more defect bits as a result of the third operation.

The original test patterns may have different values from each other.

The generating the first information may further include a fifth operation of repeating the first to fourth operations on the individual original test patterns.

The first information generated through the fifth operation may include pieces corresponding to the respective original test patterns.

The original test patterns may have randomness.

The pieces may be defect bitmaps.

Each of the defect bitmaps may include information on an inconsistent bit between a corresponding test pattern of the original test patterns and a corresponding read test pattern of the read test patterns.

Each of the original test patterns may have the same size as the read codeword.

The defect symbol location generating unit may generate the second information based on information on defect bits included in each of the defect bitmaps.

Each of the defect symbols may indicate that one or more symbols among corresponding symbols included in the defect bitmaps include the defect bit.

The second information may be a defect symbol map having the same size as the read codeword.

The third information may be erasure locator information that regards as an erasure each of the defect symbols.

The erasure correcting operation may be an operation of correcting at least one erasure included in at least one data symbol included in the read codeword.

The erasure decoding unit may be further configured to perform an operation of storing the corrected codeword in the memory unit when the erasure correcting operation succeeds.

The erasure decoding unit may be further configured to perform an operation of storing the read codeword in the memory unit when the erasure correcting operation fails.

The read codeword may be a codeword encoded according to a Reed-Solomon scheme.

The defect symbol location generating unit may generate the first information when the erasure decoding unit fails an error correcting operation performed on the read codeword.

The defect symbol location generating unit may generate the first information when the erasure decoding unit fails an erasure correcting operation performed on the read codeword.

DETAILED DESCRIPTION

In the specification, well-known components irrelevant to the substance of the present disclosure may be omitted. It will be understood that when an element is referred to as being "connected to" or "coupled to" another element, the element may be directly connected to or coupled to the other element, or electrically connected to or coupled to the other element with one or more elements interposed therebetween. In the description throughout the specification, it will be understood that when information or data is provided from one element to another element, information or data may be directly or indirectly provided between the elements interposed therebetween. In addition, it will also be understood that the terms "comprises," "comprising," "includes," and "including" when used in this specification do not preclude the presence of one or more other elements but may further include or have the one or more other elements, unless otherwise mentioned. In the specification, some components are described in singular forms, but the present disclosure is not limited thereto, and it will be understood that the components may be formed in plural.

Figure 1:
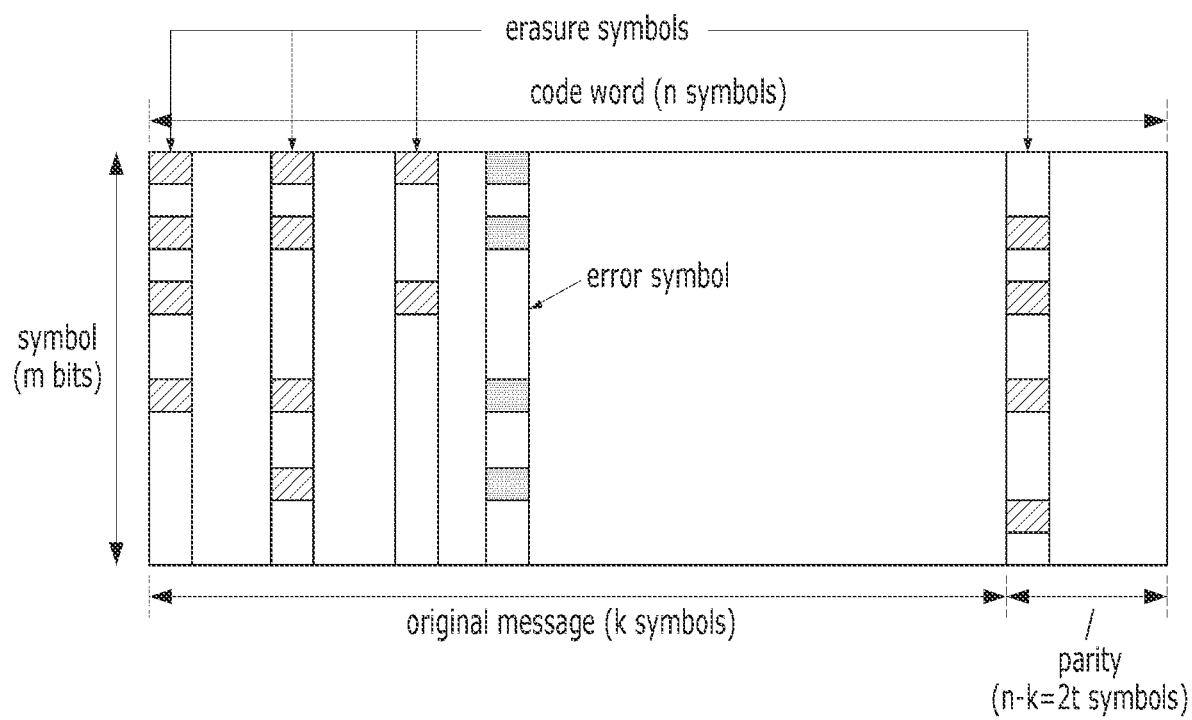
FIG. 1 is a diagram illustrating a Reed-Solomon (RS) decoding scheme.

FIG. 1 is a diagram illustrating a Reed-Solomon (RS) decoding scheme.

FIG. 1 illustrates a codeword composed of 'n' symbols including 'k' data symbols and '2t' parity symbols.

According to a conventional RS decoding scheme, errors of maximum 't' data symbols included in the codeword may be corrected. That is, according to the conventional RS decoding scheme, a location of a single data symbol, i.e., an error symbol, containing one or more errors may be detected from a codeword and the errors may be corrected statistically by two parity symbols. The conventional RS decoding scheme includes a process of calculating a syndrome of a codeword, a process of calculating an error location polynomial and error evaluation polynomial corresponding to a location and magnitude of an error in the codeword, and a process of calculating the location and magnitude of the error by using the error location polynomial and the error evaluation polynomial.

In this specification, a RS decoding operation according to the conventional RS decoding scheme is defined as an error decoding operation.

A RS decoding scheme that is more advanced than the conventional RS decoding scheme is an errata correction RS decoding scheme. Herein, an errata includes an error of a conventional sense and an erasure. Besides an error, data stored in a memory medium may include an erasure having a logical state that cannot be determined as a value of zero (0) or one (1) for various reasons. Since the erasure does not have a fixed value, the erasure is a target to be corrected to have the fixed value. According to the errata correction RS decoding scheme, an errata within a data symbol including an erasure may be corrected statistically by a single parity symbol. Herein, information on a location of the erasure, hereinafter, referred to as erasure location information, is provided from an external device. As illustrated in FIG. 1, according to the errata correction RS decoding scheme, error and erasure of maximum '2e+p (≤2t)' errata symbols included in the codeword may be corrected by '2t' parity symbols. Herein, 'e' is a number of error symbols whose locations are unknown and 'p' is a number of erasure symbols.

In this specification, an RS decoding operation according to the errata correction RS decoding scheme is defined as an errata decoding operation.

The errata correction RS decoding scheme is disclosed in the paper "NEW SCALABLE DECODER ARCHITECTURES FOR REED-SOLOMON CODES, IEEE TRANSACTIONS ON COMMUNICATIONS, VOLUME 63, August 2015" and U.S. Pat. No. 8,347,193 "PARALLEL INVERSIONLESS ERROR AND ERASURE PROCESS- ING". According to the foregoing documents, an RS decoder may correct errors of maximum 't' data symbols included in the codeword according to the conventional RS decoding scheme when the erasure location information is not provided from the external device, and may correct errors and erasures of the maximum '2e+p (≤2t)' errata symbols included in the codeword according to the errata correction RS decoding scheme when the erasure location information is provided from the external device. According to the documents, an erasure locator corresponding to the erasure location information may be generated from the erasure location information provided from the external device and an erasure may be corrected on the basis of the erasure locator.

According to the documents, the RS decoder might not perform the errata decoding operation but may perform only the error decoding operation when the erasure location information is not provided from the external device. That is, the RS decoder might not perform erasure correction unless the erasure location information is provided from the external device. According to the documents, the RS decoder may perform the erasure correction only when the erasure location information is provided from the external device. That is, according to the documents, the erasure correction of the RS decoder depends only on the erasure location information which is provided from the external device and is predetermined. Therefore, even though the erasure location information has been predetermined for any reason, when a new physical defect occurs while the memory medium operates at a later time, the predetermined erasure location information becomes meaningless and new erasure location information according to the new physical defect is required.

According to an embodiment of the present disclosure, in the errata decoding operation, an erasure correction device and an erasure correction method may be provided in which the erasure location can be identified even without the erasure location information being provided from the external device.

Figure 2:
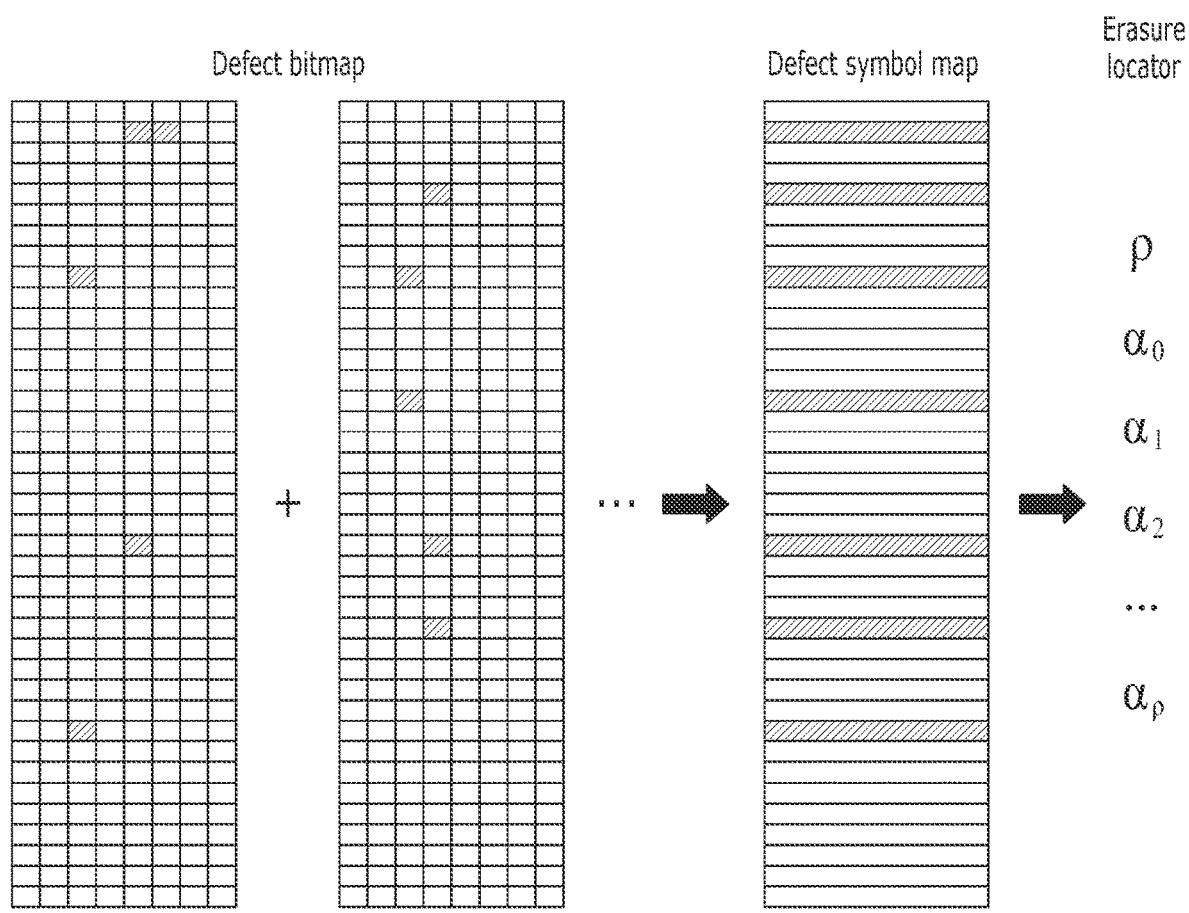
FIG. 2 is a diagram illustrating a scheme for identifying a erasure location according to an embodiment of the present disclosure.

FIG. 2 is a diagram illustrating a scheme for identifying a erasure location according to an embodiment of the present disclosure.

An errata correction device according to an embodiment of the present disclosure may write an original test pattern to a specific memory unit included in a memory medium and may store the original test pattern in the memory unit. In an embodiment, the errata correction device according to an embodiment the present disclosure may perform an error decoding operation on a codeword read from the memory unit according to a conventional RS decoding scheme or an errata correction RS decoding scheme and may store the original test pattern in the memory unit when error correction fails as a result of the error decoding operation. In this case, the codeword, which has been stored in the memory unit, may be separately buffered in a buffer, and if necessary, the buffered codeword may be stored again in the memory unit at a later time.

The original test pattern may have any value as long as it has randomness. For example, all bits included in the original test pattern may each have a value of zero (0) or one (1). For example, among the bits included in the original test pattern, bits corresponding to adjacent memory cells may have flipped values. For example, the original test pattern may have a value capable of causing data transition between bit lines connected to the memory medium. For example, the original test pattern may have inverted values of another original test pattern. For example, a read codeword RD-CDWD and its inverted codeword, which are to be described later, may each serve as the original test pattern. The original test pattern may have a size corresponding to the codeword. For the following reason, it is not necessary to perform error correction code (ECC) encoding and decoding operations on the original test pattern, and therefore, the original test pattern does not need to include a parity symbol.

The test pattern stored in the memory unit may be read as a read test pattern. The errata correction device according to an embodiment of the present disclosure does not perform the ECC decoding operation on the read test pattern. The errata correction device according to an embodiment of the present disclosure may compare the read test pattern with the original test pattern on the bit-by-bit basis.

When the result of the comparison indicates a defect bit, i.e., an inconsistent bit between the read test pattern and the original test pattern, it may be regarded that a physical defect has occurred in a location corresponding to the defect bit in the memory unit. A process of detecting the defect bit through the comparison between the original test pattern and the read test pattern may be repeated a plurality of times. The repetitions may be performed while randomly changing a value of the original test pattern. As the number of repetitions increases, the reliability of the process of detecting the physical defect may increase.

The errata correction device according to an embodiment of the present disclosure may generate information on one or more defect bits identified through the repetitions. For example, the errata correction device may generate information on a defect bit identified a predetermined threshold number of times or more during the repetitions. The threshold number of times is at least once. In addition, a condition of the defect bit generated as the information may be set in various ways.

In an embodiment, the information on the defect bits may be generated in the form of a bitmap. A defect bitmap may have a size corresponding to the codeword. As illustrated in FIG. 2, the errata correction device according to an embodiment of the present disclosure may generate one or more defect bitmaps as the information on the defect bits. FIG. 2 illustrates the defect bitmaps respectively corresponding to the repetitions. Each of the defect bitmaps may have a codeword size, and FIG. 2 illustrates the defect bits identified through each of the repetitions respectively corresponding to the defect bitmaps.

The errata correction device according to an embodiment of the present disclosure may generate information on one or more defect symbols based on the information on one or more defect bits identified through the repetitions, for example, based on the defect bitmaps. For example, the information on the defect symbols is a single defect symbol map. The defect symbol indicates that one or more symbols among corresponding symbols included in the defect bitmaps includes a defect bit. The errata correction device according to an embodiment of the present disclosure may generate the defect symbol map including all defect symbols included in the defect bitmaps by performing an OR operation on the defect bitmaps on a symbol-by-symbol basis. The defect symbol map has the same size as the defect bitmap, and FIG. 2 illustrates the defect symbols in the defect symbol map.

According to an embodiment of the present disclosure, the defect symbol generated as the information may be regarded as the erasure, and the information on the defect symbol may be utilized to generate the erasure location information. That is, in the errata decoding operation, the errata correction device according to an embodiment of the present disclosure may identify the erasure location even without receiving the erasure location information from the external device. FIG. 2 illustrates an erasure locator corresponding to the erasure location information.

The errata correction device according to an embodiment of the present disclosure may perform the errata decoding operation based on the erasure location information obtained by itself i.e., without any erasure location information provided from the external device.

In an embodiment, when error correction fails as a result of performing the error decoding operation on the codeword, which is read from the memory unit, according to the conventional RS decoding scheme, as described above, the errata correction device according to an embodiment of the present disclosure may obtain the erasure location information by itself and may perform, based on the self-obtained erasure location information, the errata decoding operation on the codeword, for which the error correction has failed.

In an embodiment, when errata correction fails as a result of performing the errata decoding operation on the codeword, which is read from the memory unit, according to the errata correction RS decoding scheme, as described above, the errata correction device according to an embodiment the present disclosure may obtain the erasure location information by itself and may perform, based on the self-obtained erasure location information, the errata decoding operation again on the codeword, for which the errata correction has failed. In the present embodiment, the previous errata decoding operation may be performed on the basis of the previous erasure location information as the information previously provided from the external device or previously obtained by itself. In the present embodiment, the current errata decoding operation may be performed on the basis of the current erasure location information as the information currently obtained by itself. That is, according to the present disclosure, the erasure location information in which a current state of the memory medium is reflected may be utilized in the errata decoding operation.

Figure 3:
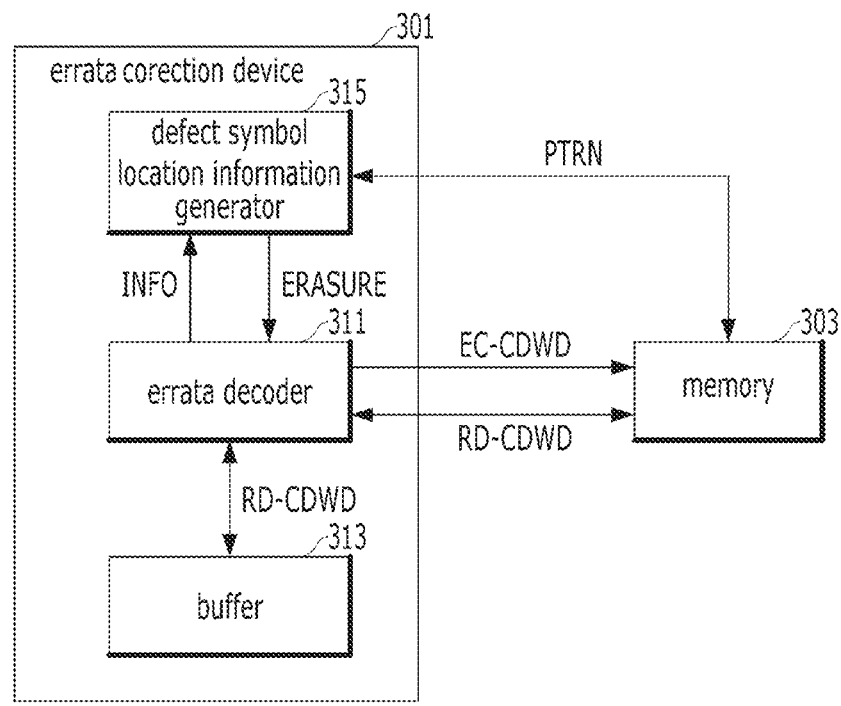
FIG. 3 is a block diagram illustrating an errata correction device according to an embodiment of the present disclosure.

FIG. 3 is a block diagram illustrating an errata correction device 301 according to an embodiment of the present disclosure. Referring to FIG. 3, the errata correction device 301 may include an errata decoding unit 311, a buffer 313, and a defect symbol location information generating unit 315. The errata decoding unit 311, the defect symbol location information generating unit and memory unit 303 include all circuits, systems, software, firmware, and devices necessary for their respective operations and functions.

The errata decoding unit 311 may read as a read codeword RD-CDWD a codeword from the memory unit 303 included in a memory medium. The read codeword RD-CDWD may have the same structure as the codeword described with reference to FIG. 1. That is, the read codeword RD-CDWD may consist of 'n' symbols including 'k' data symbols and '2t' parity symbols.

In an embodiment, the errata decoding unit 311 may buffer the read codeword RD-CDWD in the buffer 313, and, if necessary, the buffered read codeword RD-CDWD may be stored again in the memory unit 303 at a later time.

The errata decoding unit 311 may perform an ECC decoding operation on the read codeword RD-CDWD. In an embodiment, when there is no erasure location information provided from the outside or previously secured, the errata decoding unit 311 may perform an error decoding operation on the read codeword RD-CDWD according to a conventional RS decoding scheme. In an embodiment, when there is erasure location information provided from the outside or previously secured, the errata decoding unit 311 may perform an errata decoding operation on the read codeword RD-CDWD according to an errata correction RS decoding scheme.

When the error decoding operation or the errata decoding operation fails, the data decoding unit 311 may provide the defect symbol location information generating unit 315 with information INFO on the failure. The information INFO may include address information of the memory unit 303, from which the read codeword RD-CDWD has been read.

The defect symbol location information generating unit 315 may generate defect symbol location information in response to the information INFO.

Figure 4:
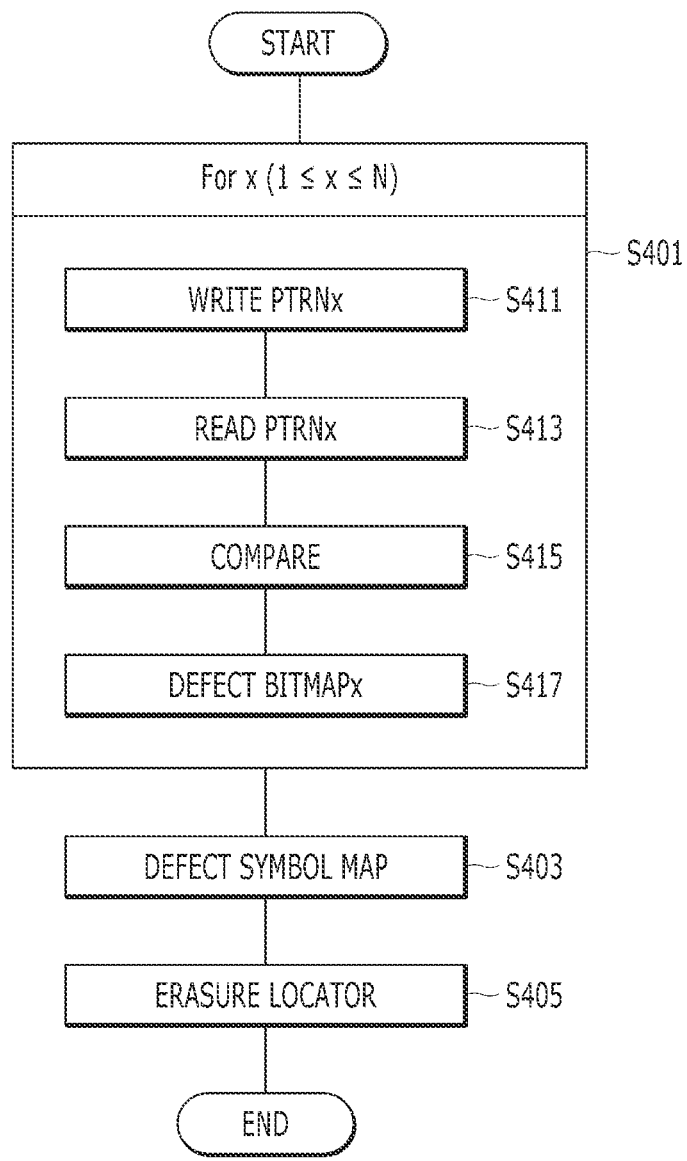
FIG. 4 is a flowchart illustrating generation of defect symbol location information according to an embodiment of the present disclosure.

FIG. 4 is a flowchart illustrating the generation of the defect symbol location information according to an embodiment of the present disclosure.

Referring to FIGS. 3 and 4, in operation S401, the defect symbol location information generating unit 315 may generate information on defect bits in response to the information INFO. In an embodiment, the defect symbol location information generating unit 315 may generate 'N' defect bitmaps as the information on the defect bits. The 'N' defect bitmaps correspond to 'N' original test patterns PTRN, respectively.

Operation S401 includes operations S411 to S417. The defect symbol location information generating unit 315 may generate the defect bitmaps respectively corresponding to the 'N' original test patterns PTRN by repeating operations S411 to S417. The defect symbol location information generating unit 315 may generate the 'N' defect bitmaps by sequentially repeating operation S401 'N' times for the individual 'N' original test patterns PTRN. The 'N' original test patterns PTRN may have randomness and may have different values from each other. For example, the read codeword RD-CDWD and an inverted codeword thereof may serve as the original test patterns.

In operation S411, the defect symbol location information generating unit 315 may store in the memory unit 303 an original test pattern PTRNx (1≤'x'≤'N'), which is selected from the 'N' original test patterns PTRN. The defect symbol location information generating unit 315 may identify the memory unit 303 from the information INFO provided from the errata decoding unit 311.

In operation S413, the defect symbol location information generating unit 315 may read as a read test pattern the original test pattern PTRNx from the memory unit 303. The original test pattern PTRNx does not need to include a parity symbol and the ECC decoding operation does not need to be performed on the read test pattern read by the defect symbol location information generating unit 315.

In operation S415, the defect symbol location information generating unit 315 may compare the original test pattern PTRNx with the read test pattern on a bit-by-bit basis. When the result of the bitwise comparison indicates a defect bit or an inconsistent bit between the read test pattern and the original test pattern PTRNx, it may be regarded that a physical defect has occurred in a location corresponding to the defect bit in the memory unit 303.

In operation S417, the defect symbol location information generating unit 315 may generate a defect bitmapx as described with reference to FIG. 2, based on one or more defect bits detected in operation S415.

When operation S401 is sequentially repeated for the individual 'N' original test patterns PTRN, 'N' defect bitmaps may be generated in the end.

In operation S403, the defect symbol location information generating unit 315 may generate information on one or more defect symbols based on the 'N' defect bitmaps generated in operation S401. For example, the information on the defect symbols is a single defect symbol map. As described with reference to FIG. 2, the defect symbol indicates that one or more symbols among corresponding symbols included in the 'N' defect bitmaps include a defect bit.

In operation S405, the defect symbol location information generating unit 315 may generate erasure location information ERASURE based on the defect symbol map generated in operation S403. For example, the erasure location information ERASURE is an erasure locator. As described with reference to FIG. 2, the defect symbol included in the defect symbol map may be regarded as an erasure and the information on the defect symbol may be utilized to generate the erasure location information.

Referring back to FIG. 3, the defect symbol location information generating unit 315 may provide the errata decoding unit 311 with the erasure location information ERASURE generated in operation S405.

The errata decoding unit 311 may perform the errata decoding operation on the read codeword RD-CDWD based on the erasure location information ERASURE provided from the defect symbol location information generating unit 315.

When the errata decoding operation based on the erasure location information ERASURE provided from the defect symbol location information generating unit 315 fails, the errata decoding unit 311 may again store in the memory unit 303 the read codeword RD-CDWD, which has been buffered in the buffer 313.

When the errata decoding operation based on the erasure location information ERASURE provided from the defect symbol location information generating unit 315 succeeds, the errata decoding unit 311 may store a corrected codeword EC-CDWD in the memory unit 303.

According to an embodiment of the present disclosure, the errata correction device 301 may obtain the erasure location information ERASURE by itself and may perform, based on the erasure location information ERASURE, the errata decoding operation on the read codeword RD-CDWD for which the error correction has failed, according to the errata correction RS decoding scheme.

Figure 5:
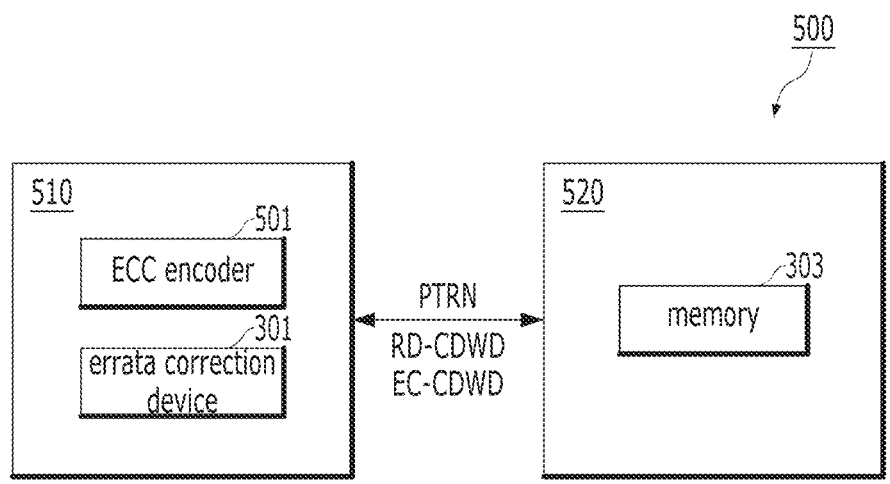
FIG. 5 is a diagram illustrating a memory system according to an embodiment of the present disclosure.

FIG. 5 is a diagram illustrating a memory system 500 according to an embodiment of the present disclosure.

Referring to FIG. 5, the memory system 500 may store data provided from an external device therein and may provide the external device with data previously stored therein. The memory system 500 may include a memory controller 510 and a memory device 520. The memory controller 510 may control an operation of the memory device 520.

In response to control of the memory controller 510, the memory device 520 may store therein data provided from the memory controller 510 or provide the memory controller 510 with data stored therein. The memory device 520 may include a memory medium and the memory medium may include the memory unit 303 illustrated in FIG. 3. The memory medium may representatively be a DRAM but the present disclosure is not limited thereto. According to an embodiment, as described with reference to FIGS. 3 and 4, the read codeword RD-CDWD may be read from the memory unit 303. According to an embodiment, as described with reference to FIGS. 3 and 4, the original test patterns PTRN may be stored in the memory unit 303, and then be read as read test patterns. According to an embodiment, as described with reference to FIGS. 3 and 4, the read codeword RD-CDWD may be stored again in the memory unit 303 or the corrected codeword EC-CDWD may be stored in the memory unit 303.

The memory controller 510 may control the memory device 520 and may write/read data into/from the memory device 520. The memory controller 510 may include an ECC engine. The ECC engine may include an ECC encoder 501 and an ECC decoder 301.

The ECC decoder 301 may perform an ECC decoding operation on data read as the read codeword RD-CDWD from the memory unit 303. According to an embodiment, the ECC decoder 301 may be the errata correction device 301 described with reference to FIGS. 3 and 4. According to an embodiment, the ECC decoding operation may be an operation of correcting an error or errata included in the read codeword RD-CDWD according to at least one of the above-described error correction scheme and errata correction scheme.

The ECC encoder 501 may perform an ECC encoding operation on data to be stored in the memory unit 303. The ECC encoding operation may be an operation of generating the codeword illustrated in FIG. 1 and generating parity symbols for the data to be stored in the memory unit 303 according to any ECC encoding scheme regardless of the type as long as it enables the ECC decoding operation. According to an embodiment, the ECC encoding scheme may be an RS encoding scheme.

According to an embodiment of the present disclosure, an improved erasure or errata correction scheme may be provided.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A method of correcting an erasure, the method comprising:
    generating first information identifying positions of defective bits respectively regarded as corresponding to one or more defects included in a memory unit by reading prior stored randomized test patterns and repetitively bit-by-bit comparing read data from the prior stored randomized test patterns to the prior stored randomized test patterns;
    generating second information for indicating one or more codeword defective symbols among codeword symbols;
    generating third information on a location of an erasure of the one or more codeword defective symbols read from the positions of the defective bits; and
    performing, based on the third information, an erasure correcting operation on a read codeword read from the memory unit at the location having the one or more codeword defective symbols.

2. The method of claim 1, wherein the generating the first information identifying the positions of the defective bits includes:
    storing, as a first operation, in the memory unit a selected test pattern from one or more original test patterns;
    reading, as a second operation, as a read test pattern the test pattern from the memory unit;

detecting, as a third operation, as a defect bit an inconsistent bit between the selected pattern and the read test pattern; and generating, as a fourth operation, the first information indicating which bits in the memory unit are the one or more defective bits as a result of the third operation.

3. The method of claim 2, wherein:

the original test patterns have different values from each other, the generating the first information further includes repeating, as a fifth operation, the first to fourth operations on the individual original test patterns, and the first information generated through the fifth operation includes pieces corresponding to the respective original test patterns.

4. The method of claim 2, wherein the original test patterns have randomness.

5. The method of claim 3, wherein:

the pieces are defect bitmaps, and each of the defect bitmaps includes information on an inconsistent bit between a corresponding test pattern of the original test patterns and a corresponding read test pattern of the read test patterns.

6. The method of claim 5, wherein each of the original test patterns has the same size as the read codeword.

7. The method of claim 6, wherein the second information is generated on the basis of information on the defective bits included in each of the defect bitmaps.

8. The method of claim 7, wherein each of the codeword defective symbols indicates that one or more symbols among corresponding symbols included in the defect bitmaps include the defective bit.

9. The method of claim 1, wherein the second information is a defect symbol map having the same size as the read codeword.

10. The method of claim 1, wherein the third information is erasure locator information that regards as an erasure each of the codeword defective symbols.

11. The method of claim 10, wherein the erasure correcting operation is an operation of correcting at least one erasure included in at least one data symbol included in the read codeword.

12. The method of claim 11, further comprising storing the corrected codeword in the memory unit when the erasure correcting operation succeeds.

13. The method of claim 11, further comprising storing the read codeword in the memory unit when the erasure correcting operation fails.

14. The method of claim 1, wherein the read codeword is a codeword encoded according to a Reed-Solomon scheme.

15. The method of claim 1, wherein the generating the first information is performed in response to failure of an error correcting operation performed on the read codeword.

16. The method of claim 1, wherein the generating the first information is performed in response to failure of an erasure correcting operation performed on the read codeword.

17. A device utilizing first, second, and third information for correcting an erasure, the device comprising:

a defect symbol location generating unit configured to generate the third information on a location of the erasure; and an erasure decoding unit configured to perform, based on the third information, an erasure correcting operation on a read codeword read from a memory unit, wherein the defect symbol location generating unit is further configured to:

generate the first information identifying positions of defective bits respectively regarded as corresponding to one or more defects included in the memory unit by reading prior stored randomized test patterns and repetitively bit-by-bit comparing read data from the prior stored randomized test patterns to the prior stored randomized test pattern, and generate the second information for indicating one or more codeword defective symbols among codeword symbols, and wherein the defect symbol location generating unit generates the third information on the location of the erasure based on the positions of defective bits.

18. The device of claim 17, wherein the generating the first information identifying the positions of the defective bits includes:

storing, as a first operation, in the memory unit a selected test pattern from one or more original test patterns, reading, as a second operation, as a read test pattern the test pattern from the memory unit, detecting, as a third operation as a defect bit an inconsistent bit between the selected pattern and the read test pattern, and generating, as a fourth operation, the first information indicating which bits in the memory unit are the one or more defective bits as a result of the third operation.

19. The device of claim 18, wherein:

the original test patterns have different values from each other, and the generating the first information further includes a fifth operation of repeating the first to fourth operations on the individual original test patterns, and the first information generated through the fifth operation includes pieces corresponding to the respective original test patterns.

20. The device of claim 18, wherein the original test patterns have randomness.

21. The device of claim 19, wherein:

the pieces are defect bitmaps, and each of the defect bitmaps includes information on an inconsistent bit between a corresponding test pattern of the original test patterns and a corresponding read test pattern of the read test patterns.

22. The device of claim 21, wherein each of the original test patterns has the same size as the read codeword.

23. The device of claim 22, wherein the defect symbol location generating unit generates the second information based on information on the defective bits included in each of the defect bitmaps.

24. The device of claim 23, wherein each of the codeword defective symbols indicates that one or more symbols among corresponding symbols included in the defect bitmaps include the defect bit.

25. The device of claim 17, wherein the second information is a defect symbol map having the same size as the read codeword.

26. The device of claim 17, wherein the third information is erasure locator information that regards as an erasure each of the codeword defective symbols.

27. The device of claim 26, wherein the erasure correcting operation is an operation of correcting at least one erasure included in at least one data symbol included in the read codeword.

28. The device of claim 27, wherein the erasure decoding unit is further configured to perform an operation of storing the corrected codeword in the memory unit when the erasure correcting operation succeeds.

29. The device of claim 27, wherein the erasure decoding unit is further configured to perform an operation of storing the read codeword in the memory unit when the erasure correcting operation fails.

30. The device of claim 17, wherein the read codeword is a codeword encoded according to a Reed-Solomon scheme.

31. The device of claim 17, wherein the defect symbol location generating unit generates the first information when the erasure decoding unit fails an error correcting operation performed on the read codeword.

32. The device of claim 17, wherein the defect symbol location generating unit generates the first information when the erasure decoding unit fails an erasure correcting operation performed on the read codeword.

* * * * *